(12) United States Patent
Huang et al.

(10) Patent No.: US 6,995,601 B2
(45) Date of Patent: Feb. 7, 2006

(54) FUSE STATE DETECTION CIRCUIT

(75) Inventors: Chien-Hua Huang, Hsinchu (TW);
Chen-Hui Hsieh, Chu-Pei (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 9 days.

(21) Appl. No.: 10/758,144

(22) Filed: Jan. 14, 2004

(65) Prior Publication Data
US 2005/0151578 A1    Jul. 14, 2005

(51) Int. Cl.
*G01H 37/76* (2006.01)

(52) U.S. Cl. ........................ 327/525; 326/14

(58) Field of Classification Search ........... 327/525, 327/526; 326/10, 14; 365/96, 225.7

See application file for complete search history.

(56) References Cited

U.S. PATENT DOCUMENTS

| | | | | |
|---|---|---|---|---|
| 4,837,520 A | * | 6/1989 | Golke et al. | 324/550 |
| 5,291,139 A | * | 3/1994 | Fruhauf et al. | 324/550 |
| 5,731,733 A | * | 3/1998 | Denham | 327/525 |
| 5,748,031 A | * | 5/1998 | Best | 327/525 |
| 5,812,477 A | | 9/1998 | Casper et al. | 365/225.7 |
| 6,087,889 A | * | 7/2000 | Mok | 327/525 |
| 6,208,549 B1 | | 3/2001 | Rao et al. | 365/96 |
| 6,384,664 B1 | | 5/2002 | Hellums et al. | 327/525 |

* cited by examiner

*Primary Examiner*—Tuan T. Lam
(74) *Attorney, Agent, or Firm*—Duane Morris LLP

(57) ABSTRACT

A fuse state detection circuit (300) has a reference circuit part (302, 302') and a fuse detection circuit part (308, 308'), the reference circuit part (302, 302') having a fuse (304, 304') identical to a fuse (306, 306') under detection. A reference voltage is between a voltage of a blown fuse (306, 306') under detection and a voltage of an un-blown fuse (306, 306') under detection, thus distinguishing a blown state of the fuse (306, 306') under detection from an un-blown state of the fuse (306, 306') under detection.

22 Claims, 7 Drawing Sheets

FUSE STATE DETECTION CIRCUIT

FIELD OF THE INVENTION

The invention relates to a fuse state detection circuit having a reference fuse and a fuse under detection, which reduce both layout mismatch and inconsistent electrical characteristics. Further, the invention relates to a fuse detection circuit that distinguishes a blown state of a fuse from an un-blown state of the fuse.

BACKGROUND

Programmable devices in complex electrical circuits are in widespread use for changing the circuits after fabrication. A laser fuse and an electrical fuse are two types of programmable devices. A laser fuse is programmed or blown by a laser tool before chip packaging. An electrical fuse can be programmed at any time by a fuse programming circuit within a packaged chip. The fuse programming circuit passes a high current through an electrical fuse to burn or program the fuse. The electrical fuse is said to be burned or blown when a current larger than a threshold current of about 5 mA flows through the fuse for a time period adequate to burn away the fuse, until the resistance of the blown fuse increases to a range of hundreds of kilo Ohms, indicating the fuse is open. After a fuse is blown, or programmed, the fuse state or fuse status is detected or sensed to determine that the fuse is blown or un-blown. A fuse state detection circuit senses the resistance value of the fuse to determine the fuse state. The fuse state detection circuit must detect whether a fuse is inadequately blown, to avoid detecting the inadequately blown fuse as being open.

SUMMARY OF THE INVENTION

According to the invention, a reference fuse replaces a reference resistor in a fuse detection circuit.

According to an embodiment of the invention, a reference fuse and a fuse to be detected are made with substantially the same materials, and have substantially the same dimensions and layout on a circuit board to reduce layout mismatch.

An embodiment of a detection circuit for indicating a blown state or an un-blown state of a fuse under detection has a fuse under detection and produces a fuse detection voltage corresponding to a detection current in the fuse under detection. The fuse detection circuit produces a reference voltage corresponding to a current in a reference fuse that is identical to the fuse under detection in its un-blown state. The reference voltage is between a fuse detection voltage corresponding to an un-blown state of the fuse under detection and a fuse detection voltage corresponding to a blown state of the fuse under detection. The fuse detection voltages, compared to the reference voltage, are distinguished from each other.

Further, an embodiment of a detection circuit has one or more fuse detection circuit parts each having a fuse under detection and a reference circuit part having a reference fuse identical to each fuse under detection in their un-blown states. The reference circuit part and each of the fuse detection circuit parts have respective current mirror transistors. The current mirror transistors of fuse detection circuit parts are smaller than the current mirror transistor in the reference circuit part.

Another embodiment of the present invention is a method of detecting a blown state or un-blown state of a fuse under detection; by generating a fuse detection voltage in a fuse detection circuit part, the fuse detection circuit part having the fuse under detection; and by generating a reference voltage in a reference circuit part, the reference circuit part having a reference fuse identical to the fuse under detection in its un-blown state; and comparing the reference voltage and the fuse detection voltage to determine whether the fuse under detection is blown or un-blown.

Another embodiment of the present invention is a method of making a fuse detection circuit; by fabricating a fuse detection circuit part having a fuse under detection; and fabricating a reference circuit part having a reference fuse identical to the fuse under detection in its un-blown state; and fabricating a comparator for comparing a reference voltage in the reference circuit part with a voltage in the fuse detection circuit part to determine whether the fuse under detection is blown or un-blown.

Embodiments of the invention will now be described by way of example with reference to the accompanying drawings.

DETAILED DESCRIPTION

Figure 1:
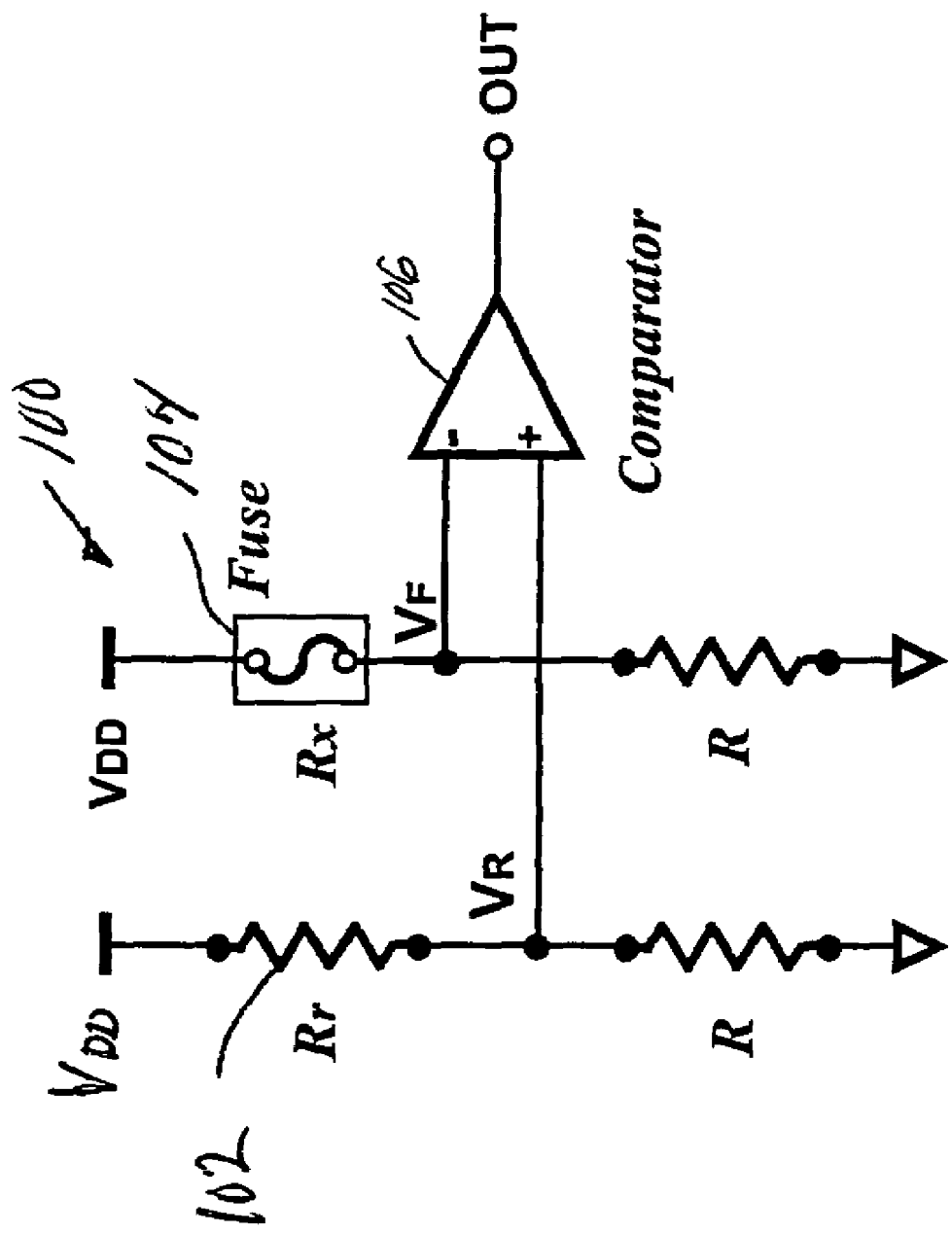
FIG. 1 is a prior art fuse state detection circuit.

FIG. 1 discloses a prior art fuse state detection circuit (100) having a reference resistor (102), indicated by its reference resistance Rr, for comparing with a fuse resistance Rx of a fuse (104) to determine the state of the fuse (104).

The input voltage to the reference resistor (102) and the fuse (104) is $V_{DD}$.

The state of the Fuse is determined by the fuse resistance Rx, wherein,

Rx=Ri for the initial resistance of an un-blown Fuse, and
Rx=Rb for the resistance of a blown Fuse, and
Ri<Rb
$V_F=V_{Fi}$ for the detected voltage of an un-blown Fuse, and
$V_F=V_{Fb}$ for the detected voltage of a blown Fuse.

The sensing margin is denoted as ΔV, the voltage difference between that of the un-blown fuse and that of the blown fuse.

Thus, $\Delta V = V_{Fi} - V_{Fb} = \{R/(Ri+R) - R/(Rb+R)\}\{V_{DD}\} = (Rb-Ri)(V_{DD})/R(1+Ri/R)(1+Rb/R)$.

When a reference resistance Rr is selected in a range of Ri<Rr<Rb, then make $V_R = V_{Fb} + \Delta V/2$, such that $V_{Fi} > V_R > V_{Fb}$.

The circuit (100) has a comparator (106) for comparing the voltages $V_R$ and $V_F$ to produce an output voltage "OUT" to indicate $V_{Fi} > V_R$ for the detected voltage of an un-blown fuse, or to indicate $V_R > V_{Fb}$ for the detected voltage of a blown fuse.

The circuit (100) of FIG. 1 has a first resistor R and the reference resistor Rr in a reference part of the circuit (100), and a second resistor R and the fuse Rx in a detection part of the circuit (100). Each time a detection operation is performed, the input voltage $V_{DD}$ causes a reference electrical current to flow through the first resistor R and the reference resistor Rr in the reference part of the circuit (100). Further, the input voltage $V_{DD}$ causes a detection current to flow through the second resistor R and the fuse Rx in the detection part of the circuit (100). This current flows in response to the input voltage $V_{DD}$ cause permanent electrical characteristics shifts of the resistors R, R, Rr and Rx. Any differences in the electrical characteristics among the resistors R, R, Rr and Rx at the beginning of a detection operation will cause different electrical characteristics shift. If the material or geometric layout of the fuse Rx is different from that of the resistors R, R it may have a different electrical characteristics shift than that of the resistors R, R after a number of fuse detection operations, which may cause incorrect detection of the fuse state. If the material or geometric layout of the fuse Rx is different from that of the reference resistor Rr, it may have a different electrical characteristics shift than that of the reference resistor Rr, after a number of fuse detection operations, which may cause incorrect detection of the fuse state.

Figure 2:
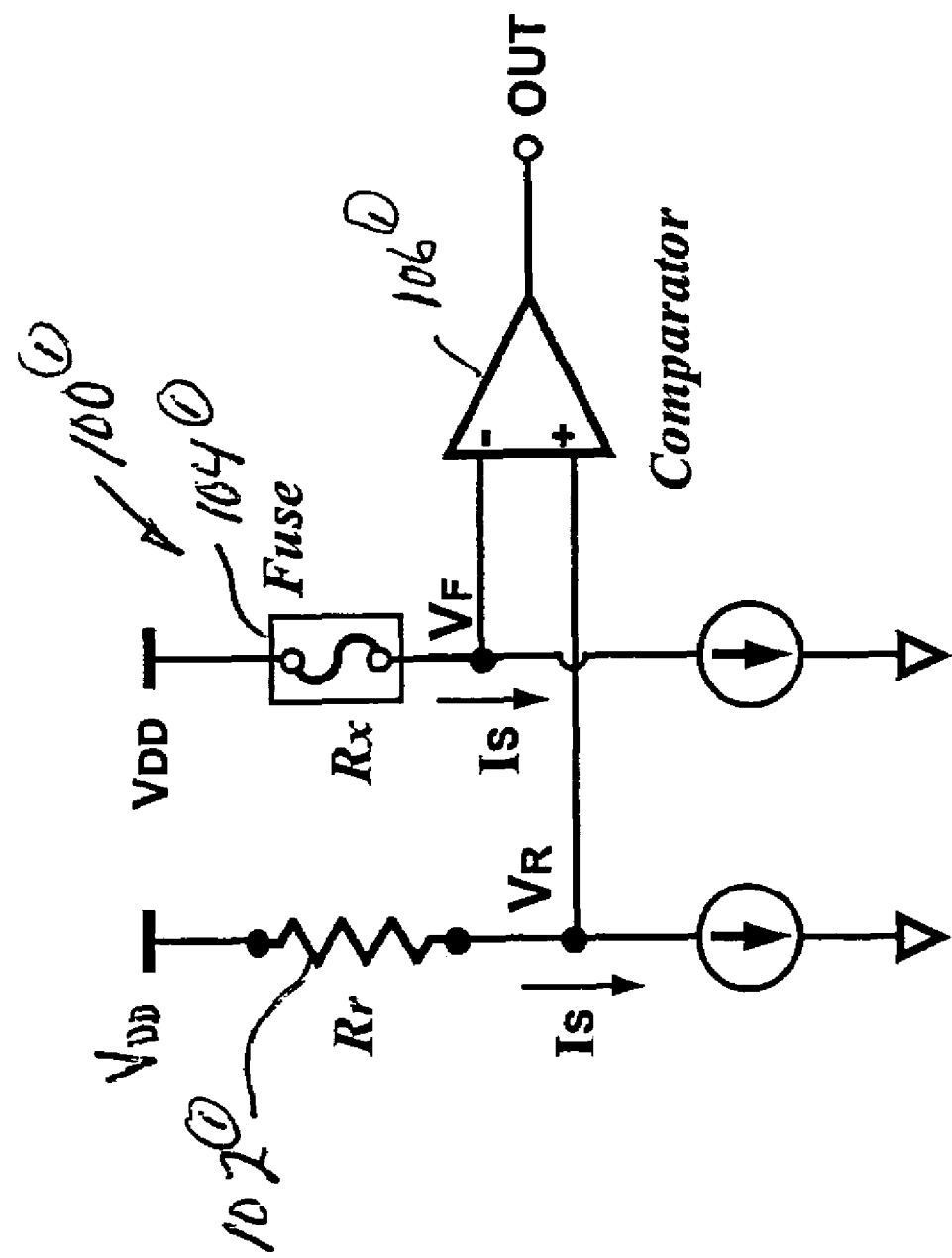
FIG. 2 is a prior art fuse state detection circuit.

FIG. 2 discloses another prior art fuse state detection circuit (100') having a reference resistor (102') of a reference resistance Rr, for comparing with the resistance of a fuse (104') having a fuse resistance Rx, to determine the state of the Fuse.

The input voltage to the reference resistor (102) and the fuse (104) is $V_{DD}$.

The state of the fuse is determined by the fuse resistance Rx, wherein,

Rx=Ri for the initial resistance of an un-blown fuse, and
x=Rb for the resistance of a blown fuse, and
i<Rb
$_F$=$V_{Fi}$ for the detected voltage of an un-blown fuse, and
$_F$=$V_{Fb}$ for the detected voltage of a blown fuse.

and Is=reference current in each of Rr and Rx.

The sensing margin (voltage difference between that of un-blown Fuse and blown Fuse) is:

$$\Delta V = V_{Fi} - V_{Fb} = (Rb-Ri)(Is) = (\Delta R)(Is)$$

Thus, the sensing margin is proportional to both Is, the reference current, and ΔR, the difference between the resistance of the blown fuse and the resistance of the un-blown fuse.

When a reference resistance Rr=(Ri+Rb)/2 then it makes $$V_R = (V_{Fi} + V_{Fb})/2$$

The circuit (100') has a comparator (106') for comparing the voltages $V_R$ and $V_F$ to produce an output voltage "OUT" to indicate $V_{Fi}/2 > V_R$ for the detected voltage of an un-blown fuse, or to indicate $V_R > V_{Fb}/2$ for the detected voltage of a blown fuse.

Each time a detection operation is performed, the input voltage $V_{DD}$ causes a reference electrical current Is to flow through the reference resistor Rr in the reference part of the circuit (100). Further, the input voltage $V_{DD}$ causes a detection current Is to flow through the fuse Rx in the detection part of the circuit (100). These current flows in response to the input voltage $V_{DD}$ cause permanent electrical characteristics shifts of the resistors Rr and Rx. The circuit (100') of FIG. 2 eliminates the first resistor R of FIG. 1 from a reference part of the circuit (100'). Further, the circuit (100') of FIG. 2 eliminates the second resistance R of FIG. 1 from a detection part of the circuit (100'). Thus, the circuit (100') of FIG. 2 has a reduced number of resistors that would undergo electrical characteristics shifts during a detection operation. The circuit (100') of FIG. 2 has only the resistors Rr and Rx that would undergo electrical characteristics shifts during a detection operation. However, any differences in the electrical characteristics among the resistors Rr and Rx at the beginning of a detection operation will cause different electrical characteristics shift during the detection operation. If the material or geometric layout of the fuse Rx is different from that of the reference resistor Rr, it may have a different electrical characteristics shift than that of the reference resistor Rr, after a number of fuse detection operations, which may cause incorrect detection of the fuse state.

Figure 3:
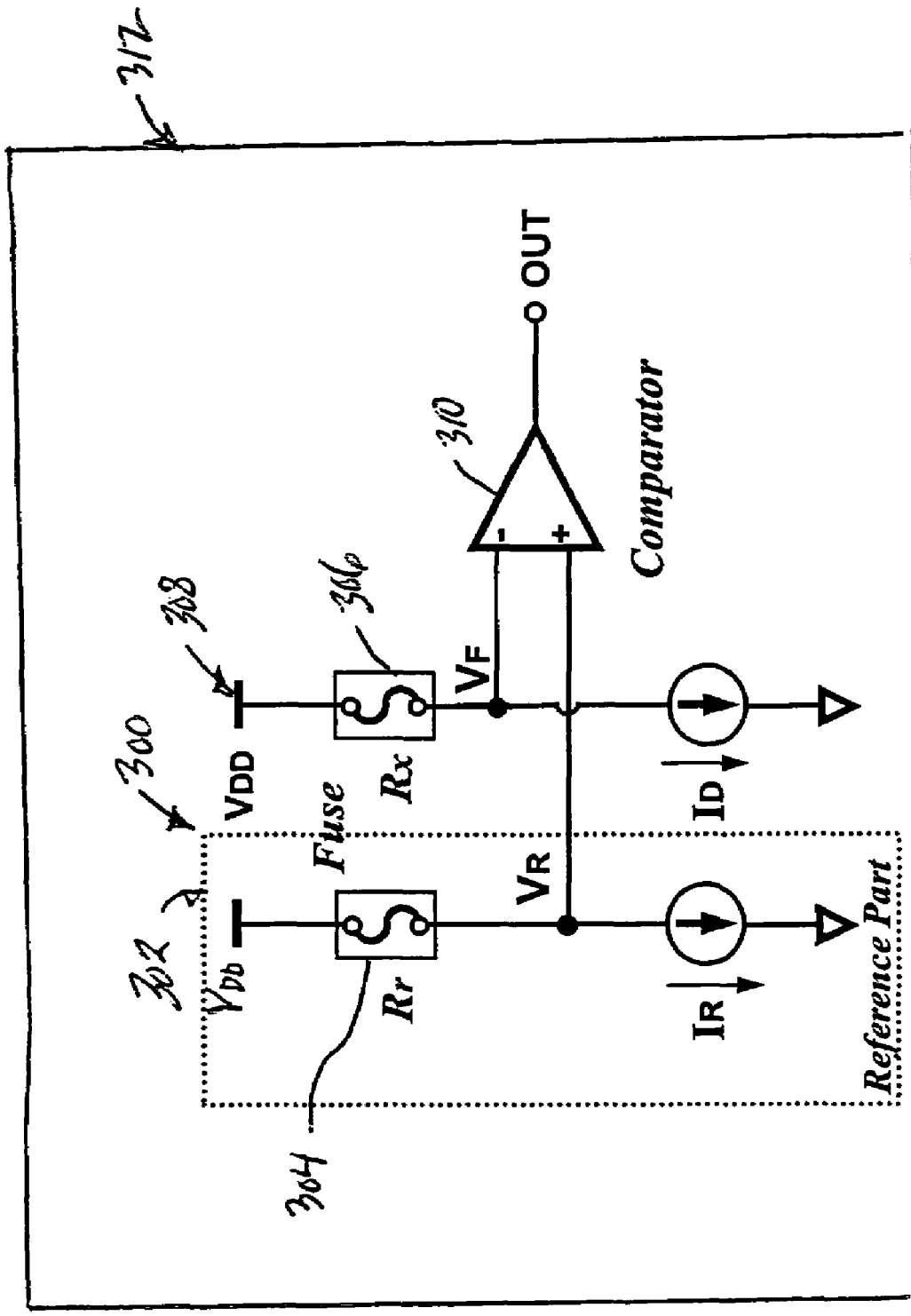
FIG. 3 is a fuse state detection circuit according to one embodiment of the invention.

FIG. 3 discloses an embodiment of a fuse state detection circuit (300) according to one embodiment of the invention. A reference circuit part or reference circuit portion (302) outputs a reference voltage $V_R$. Another embodiment of a reference circuit part (302') is discussed further below with reference to FIG. 4. With continued reference to FIG. 3, the circuit (300) has a reference fuse (304) with a reference resistance Rr, for comparing with a fuse resistance Rx of a fuse (306) of a fuse state detection circuit part or portion (308) to determine the state or status of the fuse (306). The circuit (300) has a comparator (310) for fuse state detection, or fuse status detection, by comparing the output, reference voltage $V_R$ of the reference circuit (302) and the output detection voltage $V_F$ of the fuse state detection circuit (308). According to the invention, the fuse (306) can be blown by at least passing an electrical current of sufficient magnitude to cause the fuse (306) to open, or by subjecting the fuse (306) to a laser output to cause the fuse (306) to open.

The state or status of the fuse is determined by the fuse resistance Rx, wherein, Rx=Ri for the initial resistance of an un-blown Fuse, and
Rx=Rb for the resistance of a blown Fuse, and
Ri<Rb Fuse resistance: Rx
Rx=Ri the initial resistance of un-blown fuse.
Rx=Rb the resistance of blown fuse.
Ri<Rb
IR: Reference current
ID: Detective current The sensing margin is the voltage difference between the un-blown and blown fuse states:

$$\Delta V = VFi - VFb = (Rb-Ri) \cdot ID = \Delta R \cdot ID$$

Thus, the sensing margin is proportional to a detection current ID and a difference between a blown and un-blown fuse states.

The reference fuse is chosen with a resistance Rr=Ri, and a reference current IR to make $$VR = (VFi + VFb)/2.$$

Accordingly, by locating the value of $V_R$ between VFi and VFb, then, the blown, blown or programmed state of the fuse (306) can be readily identified and distinguished from the un-blown, un-blown or un-programmed state. The output signal of the comparator (310) indicates whether the detection voltage $V_F$ is either greater than, or less than, the reference voltage $V_R$.

$$Rr \cdot IR = Ri \cdot IR = (Rb+Ri) \cdot ID/2$$

$$IR = \frac{1}{2}(1+Rb/Ri) \cdot ID$$

Due to Rb>Ri, such that IR>ID

For example
   If Rb=1.2 Ri then IR=1.1·ID
   If Rb=1.5 Ri then IR=1.25·ID
   If Rb=2 Ri then IR=1.5·ID In the circuit (300) of FIG. 3, a reference fuse (304) is the reference, and not a resistor, as in the prior art. The reference fuse (304) and the un-blown fuse (306) to be detected are substantially identical structures that have substantially identical electrical characteristics. They are fabricated with substantially the same materials, and have substantially the same dimensions and lay out on a circuit board (312), which reduces lay out differences and inconsistent characteristics shift from different materials that would contribute to electrical mismatch. For example, the reference fuse (304) and the fuse (306) are fabricated of the same material, including and not limited to, polysilicon, and have substantially the same length, width and thickness on the circuit board (312).

The identical reference fuse (304) and the fuse (306) undergo the same changes in electrical characteristics after undergoing a number of fuse detection operations. Performing a number of fuse state detection operations makes the reference fuse (304) and the fuse (306) undergo changes in electrical characteristics. According to the invention, since the reference fuse (304) and the fuse (306) have the same structure, materials and layout, they undergo the same shifts in electrical characteristics after undergoing a number of fuse state detection operations, which means that their shifts in electrical characteristics do not change relative to each other. A change in electrical characteristics of the reference fuse (304) is compensated by the same change in electrical characteristics of the fuse (306). Changes in electrical characteristics of the reference fuse (304) and the fuse (306), after undergoing a number of fuse detection operations, do not introduce errors in detection of the fuse state. Thus, the relative values of Rr and Ri control the fuse state detection without additional electrical mismatch that would be contributed by differences in structure and layout of the reference fuse (304) and the fuse (306).

Figure 4:
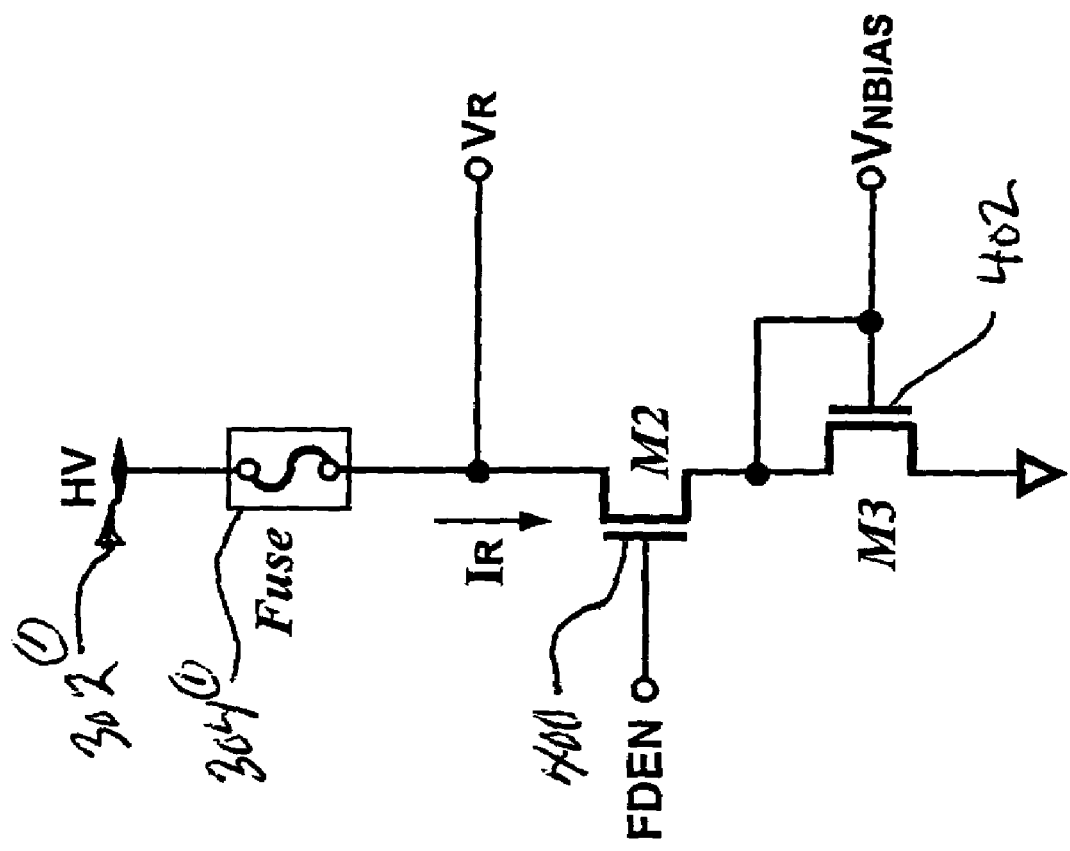
FIG. 4 is a diagram of a reference component, also referred to as, a reference circuit part or reference circuit portion according to one embodiment of the invention.

FIG. 4 discloses an embodiment of the present invention for a reference circuit part or portion (302'). The reference circuit part (302') generates a reference voltage and a reference current in response to an input fuse detection enable signal. FIG. 4 discloses the reference circuit part (302') with a reference fuse (304') at an input voltage HV and a reference current $I_R$ and output voltage $V_R$. The reference fuse (304') is in series with an n-channel MOS transistor M2 (400) that is controlled by an input signal, a fuse detection enable signal, FDEN signal, to switch on/off the circuit (302). An n-channel MOS transistor M3 (402) is for establishing a bias voltage $V_{NBIAS}$ by MOS transistor M3 (402). When FDEN goes high M2 is turned on and enables the reference component or circuit part (302) to establish a reference current $I_R$ and transfer the reference current $I_R$ to a voltage bias $V_{NBIAS}$ by MOS transistor M3 (402). The reference component or circuit part (302') outputs a reference voltage $V_R$ for comparing with a detected fuse voltage to sense the fuse state of the fuse, such as, the fuse (306) of FIG. 3, or such as, the fuse (306') of FIG. 5. After the fuse state is sensed fully out, for example, by the comparator (310) of FIG. 3, or by the comparator 310') of FIG. 5, then FDEN goes low to shut off the current path by turning off the MOS transistor M2, which extinguishes all current in the circuit (302).

Figure 5:
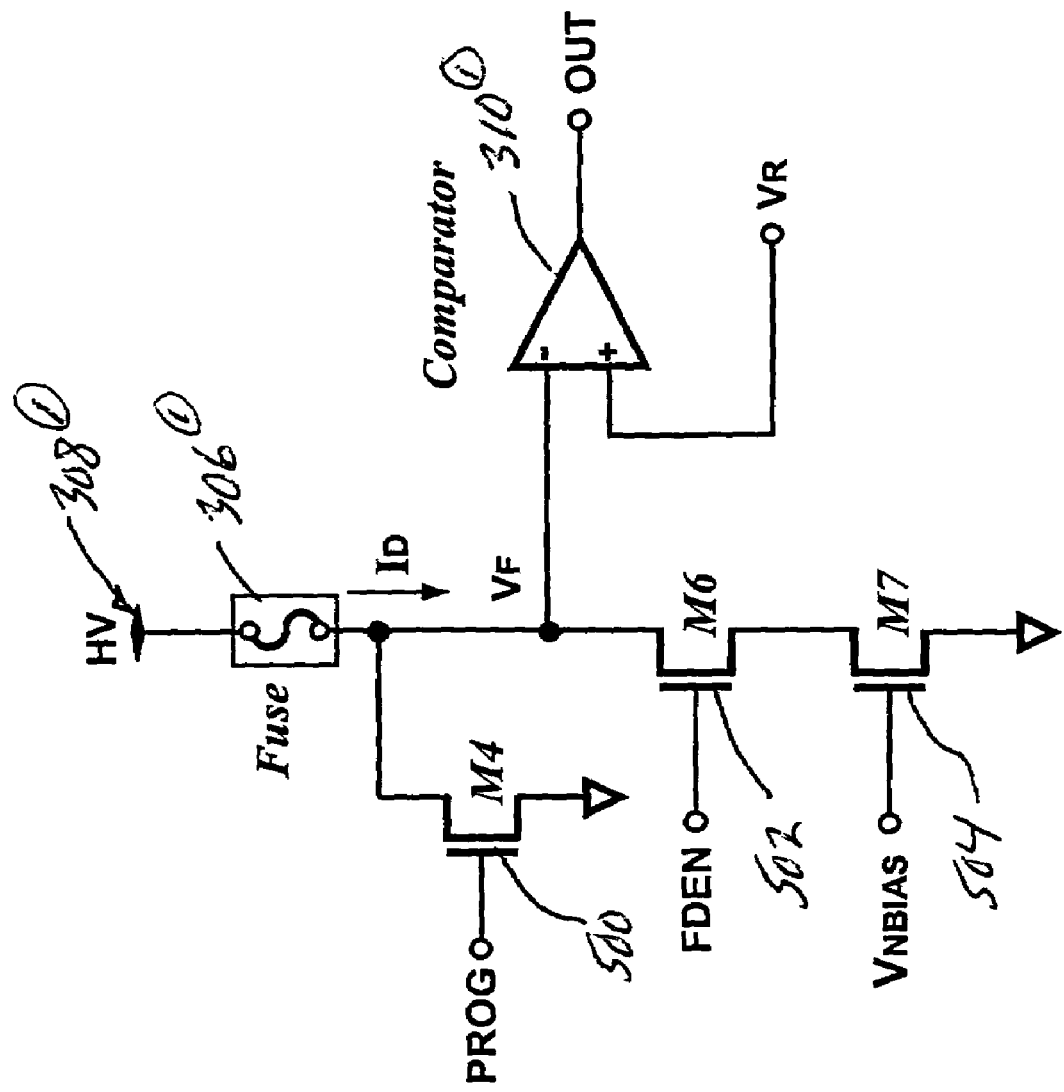
FIG. 5 is a diagram of a fuse state detection circuit part or fuse state detection circuit portion according to one embodiment of the invention.

FIG. 5 discloses another embodiment of the present invention for a fuse state detection circuit (308') having a fuse programming switch MOS transistor M4 (500) controlled by an input signal PROG. The fuse programming switch MOS transistor M4 (500) is turned on by the input signal PROG to sink to ground or earth electrical potential a large current to burn the fuse (306"). According to the invention, the fuse (306') can be blown by at least passing an electrical current of sufficient magnitude to cause the fuse (306') to open, or by subjecting the fuse (306) to a laser output to cause the fuse (306') to open.

In FIG. 5, the fuse (306') of the circuit (308') is in series with an n-MOS transistor M6 (502) is controlled by the FDEN signal, similarly as is the transistor M2 (400) of FIG. 4. The FDEN signal turns on both the transistor M6 (502) and a series MOS transistor M7 (504). The transistor M7 (504) is biased by $V_{NBIAS}$ by MOS transistor M3 (402) of the reference circuit part (302') of FIG. 4. The transistor M7 (504) is slightly smaller than the transistor M3 (402), i.e., M7<M3, which establishes a detective current $I_D$ through the fuse (306') to detect the fuse state or status. The detective current $I_D$ is smaller than the reference current $I_R$ according to the equation:

$$I_R = (\tfrac{1}{2})(1 + Rb/Ri)(I_D)$$

An embodiment of the invention has a current mirror structure. The MOS transistor M3 of the reference circuit (302') of FIG. 4, and the MOS transistor M7 (504) of the fuse state detection circuit (308') of FIG. 5, are current mirror transistors. The current mirror structure establishes a detective current $I_D$ through the fuse (306') to detect the fuse state or status. Thus, a fuse voltage $V_F$ is created by current $I_D$ through the fuse (308'). The blown or un-blown state or status of the fuse (308') is sensed by a comparator (310') that compares the detected fuse voltage $V_F$ with the reference $V_R$. The comparator (310') produces an output signal that indicates whether reference $V_R$ is either, greater than, or less than, the detected fuse voltage $V_F$.

Figure 6:
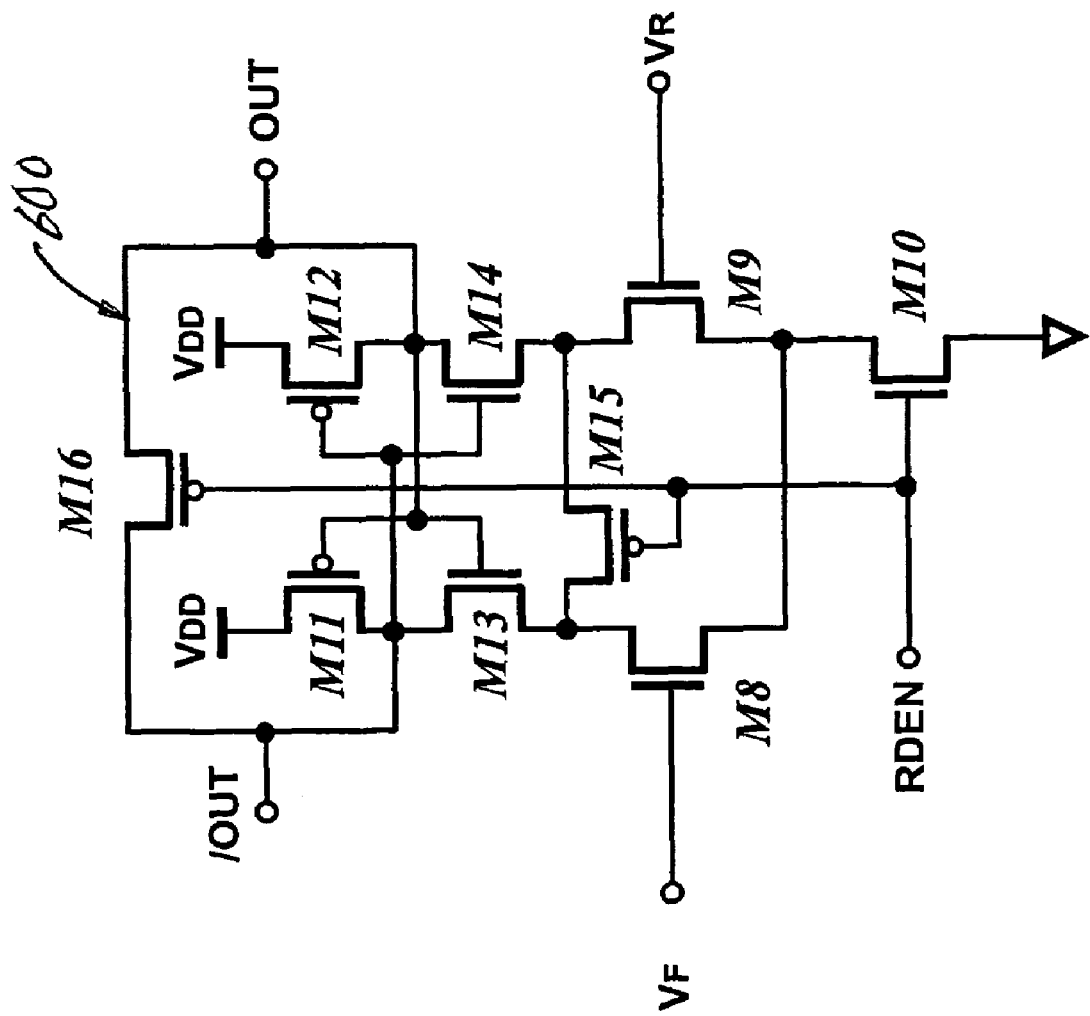
FIG. 6 is a diagram of a prior art comparator.

FIG. 6 discloses a prior art, practical comparator (600), of which VR and VF are differential inputs. RDEN is a comparator enable signal. RDEN can enable the comparator, if RDEN goes high to turn on MOS M10 and turn off equalizer MOS M15 and M16. When VF is higher than VR, the VGS of M8 is larger than M9 so that the pull low current of M8 is larger than M9 thereof the pull low speed of terminal /OUT is faster than terminal OUT. By sensing circuit M11–M14, the state of terminal /OUT will be developed to low and the state of OUT will be developed to high. When VF is lower than VR, the VGS of M8 is smaller than M9 so that the pull low current of M8 is smaller than M9 thereof the pull low speed of terminal /OUT is slower than terminal OUT. By sensing circuit M11–M14, the state of terminal /OUT will be developed to high and the state of OUT will be developed to low.

Figure 7:
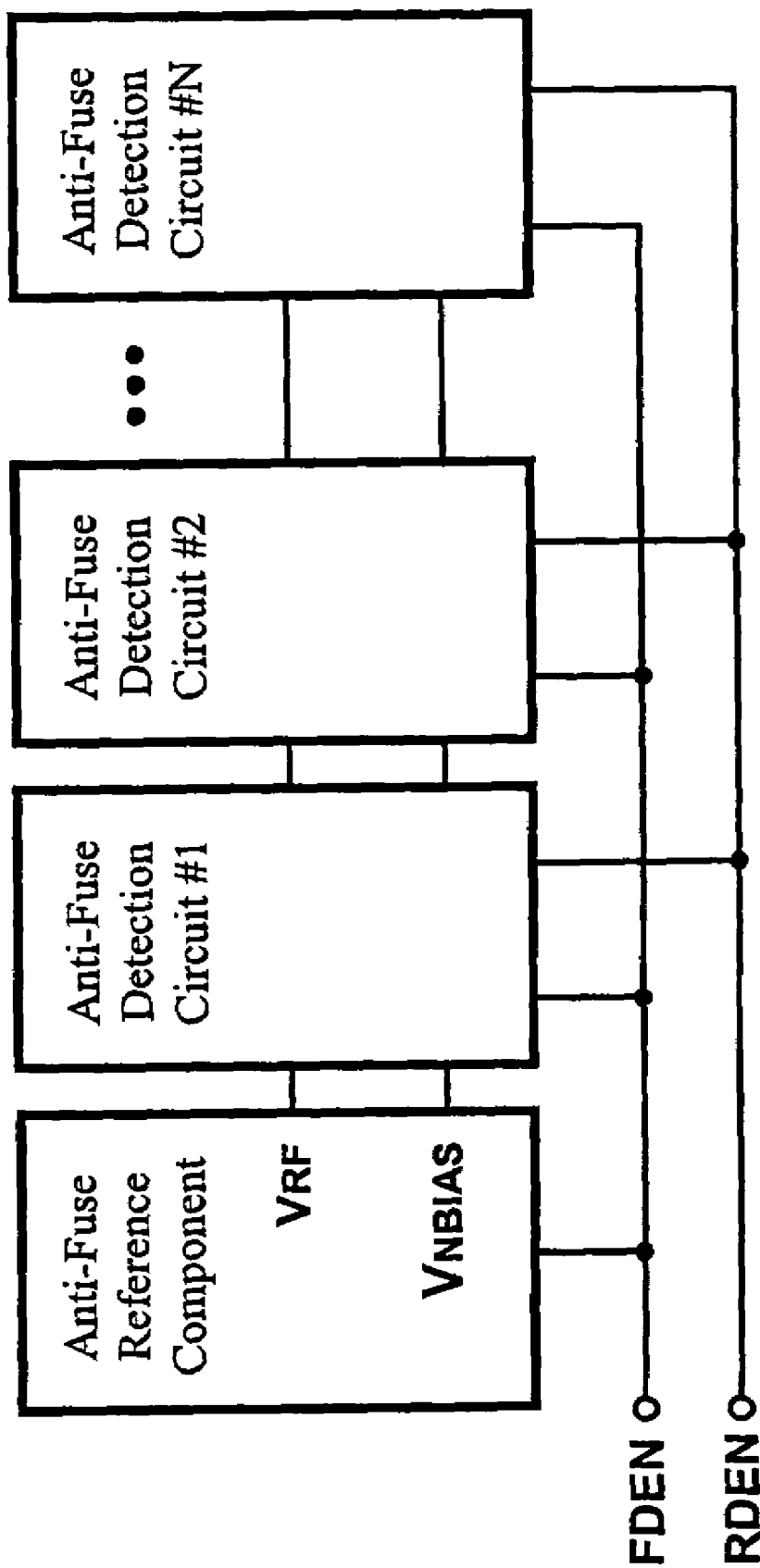
FIG. 7 is a diagram of a circuit having examples of multiple fuse state detection circuits that are capable of being driven by one reference component according to one embodiment of the invention.

FIG. 7 is a circuit diagram of examples of multiple external fuse state detection circuits (308'), (308') and (308'), for example, a series, 1, 2, . . . N., in number, that are capable of being driven by $V_R$ and $V_{NBIAS}$ by one reference component or one reference circuit part (300), as disclosed by FIG. 3, and by the fuse detection enable signal, FDEN signal, and the comparator enable signal RDEN signal. Thus, the invention includes, and is not limited to, one or more fuse state detection circuits (308') in combination with a reference circuit part (300).

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A detection circuit for indicating a blown state or un-blown state of a fuse under detection, comprising:
a fuse detection circuit part having a fuse under detection, the fuse detection circuit part producing a fuse detection voltage corresponding to a detection current in the fuse under detection;
a reference circuit part for generating a reference voltage, the reference circuit part having a reference fuse substantially identical to the fuse under detection in its un-blown state; and
the reference voltage being between a fuse detection voltage corresponding to an un-blown state of the fuse under detection and a fuse detection voltage corresponding to a blown state of the fuse under detection, thereby distinguishing the blown state from the un-blown state.

2. The detection circuit of claim 1, wherein
the reference circuit part and the fuse detection circuit part having respective transistors for receiving a fuse detection enable signal, wherein said transistors enable and disable said reference circuit part and fuse detection circuit in response to said fuse detection enable signal.

3. The detection circuit of claim 1, wherein
the reference circuit part producing a bias voltage that is supplied to the fuse detection circuit part.

4. The detection circuit of claim 1, wherein
the reference fuse and the fuse under detection having substantially the same layout on a circuit board.

5. The detection circuit of claim 1, wherein
a current mirror having a first current mirror transistor in the reference circuit part connected to a second current minor transistor in the fuse detection circuit part; and
the second current mirror transistor being smaller than the first current mirror.

6. The detection circuit of claim 5, wherein
the reference circuit part and the fuse detection circuit part having respective transistors receiving a fuse detection enable signal.

7. The detection circuit of claim 5, wherein
the first current mirror transistor supplying a bias voltage to the second current mirror transistor.

8. The detection circuit of claim 5, wherein
the reference fuse and the fuse under detection having substantially the same layout on a circuit board.

9. The detection circuit of claim 5, further comprising:
a comparator for comparing the reference voltage and the fuse detection voltage.

10. A circuit comprising:
one or more fuse detection circuit parts each having a fuse under detection;
a reference circuit part having a reference fuse identical to each fuse under detection in their un-blown states;
the reference circuit part and each of the fuse detection circuit parts having respective current mirror transistors; and
the current mirror transistor in each of the fuse detection parts being smaller than the current mirror transistor in the reference circuit part.

11. The detection circuit of claim 10, wherein
the reference fuse and each fuse under detection having substantially the same layout on a circuit board.

12. The detection circuit of claim 10, further comprising
each fuse detection circuit part producing a fuse detection voltage; and
each fuse detection circuit part having a comparator comparing the fuse detection voltage with a reference voltage produced by the reference circuit part.

13. A detection circuit for indicating a blown state or an un-blown state of a programmable fuse under detection, comprising:
a fuse detection circuit part having a fuse under detection;
a reference circuit part having a reference fuse substantially identical to the fuse under detection in its un-blown state; and
a comparator for comparing a reference voltage in the reference circuit part and a fuse detection voltage in the fuse detection circuit part to determine whether the fuse under detection is blown or un-blown, the reference voltage to be between a fuse detection voltage of an un-blown fuse under detection and a fuse detection voltage of a blown fuse under detection, thereby distinguishing a blown state from and un-blown state by comparison with the reference voltage.

14. The detection circuit of claim 13, further comprising:
a first current mirror transistor of the reference circuit part for generating a bias voltage;
a second current mirror transistor in the fuse detection circuit part for receiving the bias voltage, the second current mirror transistor being smaller relative to the first current transistor for the reference voltage to be between a fuse detection voltage of an un-blown fuse under detection and a fuse detection voltage of a blown fuse under detection, thereby distinguishing a blown state from an un-blown state by comparison wit the reference voltage.

15. The detection circuit of claim 13, wherein
the reference circuit part and the fuse detection circuit part having respective transistors receiving a fuse detection enable signal, wherein said transistors enable and disable said reference circuit part and fuse detection circuit in response to said fuse detection enable signal.

16. The detection circuit of claim 13, wherein
the reference circuit part producing a bias voltage that is supplied to the fuse detection circuit part.

17. The detection circuit of claim 13, further comprising:
the reference fuse and the fuse under detection having substantially the same layout on a circuit board.

18. A method of detecting a blown state or un-blown state of a fuse under detection, comprising:
generating a fuse detection voltage in a fuse detection circuit part, the fuse detection circuit part having the fuse under detection;
generating a reference voltage in a reference circuit part, the reference circuit part having a reference fuse substantially identical to the fuse under detection in its un-blown state, the reference voltage to be between a fuse detection voltage of an un-blown fuse under detection and a fuse detection voltage of a blown fuse under detection, thereby distinguishing a blown state from and un-blown state by comparison with the reference voltage; and
comparing the reference voltage and the fuse detection voltage to determine whether the fuse under detection is blown or un-blown.

19. The method as recited in claim 18, further comprising:
generating a bias voltage in a first current mirror transistor of the reference circuit part;
supplying the bias voltage to a second current mirror transistor in the fuse detection circuit part, the second current mirror transistor being smaller relative to the first current transistor for the reference voltage to be between a fuse detection voltage of an un-blown fuse under detection and a fuse detection voltage of a blown fuse under detection, thereby distinguishing a blown state of the fuse under detection from an un-blown state of the fuse under detection by comparison with the reference voltage.

20. A method of making a fuse detection circuit, comprising:
   fabricating a fuse detection circuit part having a fuse under detection;
   fabricating a reference circuit part having a reference fuse identical to the fuse under detection in its un-blown state; and
   fabricating a comparator for comparing a reference voltage in the reference circuit part with a voltage in the fuse detection circuit part to determine whether the fuse under detection is blown or un-blown, the reference voltage to be between a fuse detection voltage of an un-blown fuse under detection and a fuse detection voltage of a blown fuse under detection, thereby distinguishing a blown state from and un-blown state by comparison with the reference voltage.

21. The method as recited in claim 20, further comprising:
   manufacturing the reference fuse and the fuse under detection with substantially the same manufacturing process steps.

22. The method as recited in claim 20, further comprising:
   manufacturing the reference fuse and the fuse under detection with substantially the same layout on a circuit board.

* * * * *

UNITED STATES PATENT AND TRADEMARK OFFICE
CERTIFICATE OF CORRECTION

| | |
|---|---|
| PATENT NO. | : 6,995,601 B2 |
| APPLICATION NO. | : 10/758144 |
| DATED | : February 7, 2006 |
| INVENTOR(S) | : Chien-Hua Huang and Chen-Hui Hsieh |

It is certified that error appears in the above-identified patent and that said Letters Patent is hereby corrected as shown below:

Column 7, line 35, delete "minor" and insert therefor --mirror--; and

Column 8, line 30, delete "wit" and insert therefor --with--.

Signed and Sealed this

Ninth Day of January, 2007

JON W. DUDAS
*Director of the United States Patent and Trademark Office*